United States Patent
Huang et al.

(10) Patent No.: US 9,887,148 B1
(45) Date of Patent: Feb. 6, 2018

(54) FAN-OUT SEMICONDUCTOR PACKAGE STRUCTURE AND FABRICATING METHOD

(71) Applicant: POWERTECH TECHNOLOGY INC., Hsinchu County (TW)

(72) Inventors: Jen-I Huang, Hsinchu County (TW); Ching-Yang Chen, Hsinchu County (TW)

(73) Assignee: POWERTECH TECHNOLOGY INC., Hsinchu County (TW)

( * ) Notice: Subject to any disclaimer, the term of this patent is extended or adjusted under 35 U.S.C. 154(b) by 0 days.

(21) Appl. No.: 15/437,444

(22) Filed: Feb. 21, 2017

(51) Int. Cl.
*H01L 23/04* (2006.01)
*H01L 23/485* (2006.01)
*H01L 23/31* (2006.01)
*H01L 21/56* (2006.01)

(52) U.S. Cl.
CPC .......... *H01L 23/485* (2013.01); *H01L 21/563* (2013.01); *H01L 21/568* (2013.01); *H01L 23/3121* (2013.01)

(58) Field of Classification Search
CPC ......... H01L 2224/468228; H01L 2224/05548; H01L 2224/13024; H01L 2225/1058; H01L 2225/06548
USPC ........ 257/678, 698, 701, 787; 438/106, 118, 438/125, 126, 127
See application file for complete search history.

(56) References Cited

U.S. PATENT DOCUMENTS

| | | | |
|---|---|---|---|
| 7,642,128 B1 | 1/2010 | Lin | |
| 2011/0049695 A1* | 3/2011 | Shin | H01L 21/561 257/686 |
| 2011/0254155 A1* | 10/2011 | Lin | H01L 21/6835 257/737 |
| 2013/0006276 A1 | 1/2013 | Lantz | |
| 2015/0123268 A1* | 5/2015 | Yu | H01L 24/17 257/737 |
| 2016/0071820 A1* | 3/2016 | Yu | H01L 21/6835 257/737 |
| 2016/0118332 A1* | 4/2016 | Lin | H01L 22/20 257/773 |
| 2016/0155702 A1* | 6/2016 | Chen | H01L 23/5226 257/774 |

* cited by examiner

*Primary Examiner* — S. V. Clark
(74) *Attorney, Agent, or Firm* — Winston Hsu

(57) ABSTRACT

A fan-out semiconductor package includes a layer of adhesive covering a temporary carrier, a first redistribution layer disposed on the layer of adhesive, the first redistribution layer including a first metal layer having recessed areas. Metal pillars are plated to a first group of the recessed areas in the first metal layer. A semiconductor chip next is bonded to a second group of the recessed areas and a molding compound covers the semiconductor chip. The molding compound is then ground to expose tops of the metal pillars. A second redistribution layer including a second passivation layer adhering to the molding compound and a second metal layer covering openings exposing the tops of the metal pillars are then added.

20 Claims, 8 Drawing Sheets

FAN-OUT SEMICONDUCTOR PACKAGE STRUCTURE AND FABRICATING METHOD

BACKGROUND OF THE INVENTION

1. Field of the Invention

This disclosure relates to a fan-out semiconductor package structure and more specifically to FOWLP structure and fabricating method to improve stability of metal pillars during the manufacturing process.

2. Description of the Prior Art

One prior art method of semiconductor device manufacturing required the use of the use of 10-20 micron die-attach film adhesive. When the package was completed, lasers were used to make holes in the passivation layer covering the bottom of the pillars. Uneven heat distribution during the manufacturing process lowered reliability of finished devices.

Another prior art method of semiconductor device manufacturing placed a layer of metal directly on the adhesive covering the carrier. Pillars were then formed on the metal layer and areas of the metal layer not covered by the pillars were removed. Lack of a supporting structure permitted easy toppling of the pillars during subsequent operations destroying the device.

SUMMARY OF THE INVENTION

A fan-out semiconductor package is proposed which comprises a temporary carrier. A layer of adhesive covers a top surface of the temporary carrier. A first redistribution layer comprising a first passivation layer adhering to the adhesive is added. The first passivation layer comprises openings exposing the adhesive and a first metal layer electrically connected to the openings exposing the adhesive is formed. The first metal layer forms recessed areas each corresponding to one of the openings exposing the adhesive. Metal pillars are each respectively plated to a different one of a first group of the recessed areas in the first metal layer. A semiconductor chip next is bonded to a second group of the recessed areas in the first metal layer and a molding compound covers the semiconductor chip and the first redistribution layer. The molding compound is then ground to expose tops of the metal pillars. A second redistribution layer comprising a second passivation layer adhering to the molding compound is added. The second passivation layer comprises openings exposing the tops of the metal pillars and a second metal layer covering the openings exposing the tops of the metal pillars is then added. An underfill material comprising a capillary-flow material may be placed in spaces between the semiconductor chip and first redistribution layer.

A method of forming a fan-out semiconductor package comprises providing a temporary carrier, covering a top surface of the temporary carrier with a layer of adhesive, forming a first redistribution layer comprising a first passivation layer adhering to the adhesive, the first passivation layer comprising openings exposing the adhesive and a first metal layer electrically connected to the openings exposing the adhesive, the first metal layer forming recessed areas each corresponding to one of the openings exposing the adhesive. Metal pillars each respectively are plated to a different one of a first group of the recessed areas in the first metal layer. A semiconductor chip is bonded to a second group of the recessed areas in the first metal layer and the semiconductor chip and the first redistribution layer are covered with a molding compound, ground to expose tops of the metal pillars. A second redistribution layer comprising a second passivation layer adhering to the molding compound is formed, the second passivation layer comprising openings exposing the tops of the metal pillars and a second metal layer covering the openings exposing the tops of the metal pillars. An underfill material comprising a capillary-flow material may be placed in spaces between the semiconductor chip and first redistribution layer.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
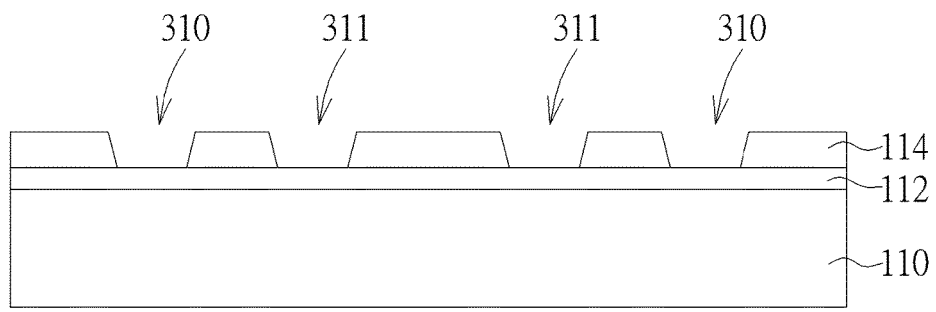
FIGS. 1-18 are cross-sectional views of a fan-out semiconductor package manufacturing process flow in accordance with embodiments of the present disclosure.

FIGS. 1 through 18 show cross-sectional views of a fan-out semiconductor package manufacturing process flow in accordance with embodiments of the present disclosure. As shown in FIG. 1, a carrier 110 is provided. The carrier 110 may comprise glass panel, silicon (e.g., a silicon wafer), silicon oxide, metal plate, or a ceramic material, as examples. An adhesive 112 is applied over the carrier 110. The adhesive 112 may comprise epoxy, silicone rubber, polyimide (PI), phenylenebenzobisoxazole (PBO), benzocyclobutene (BCB), a polymer, or a metal, as examples, although other materials may also be used. The adhesive 112 may be applied by spin-coating, printing, chemical vapor deposition (CVD), or physical vapor deposition (PVD), as examples.

Figure 2:
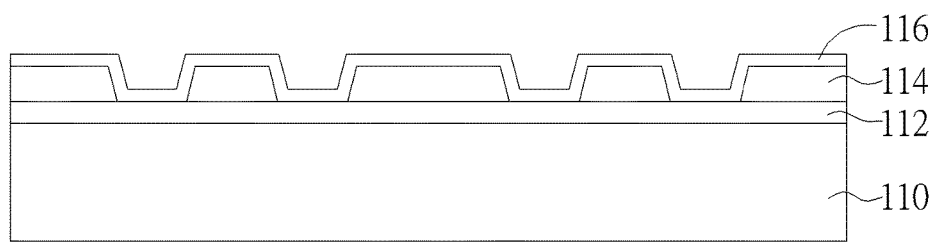

A first redistribution layer (RDL) 163 is then formed over the adhesive 112. The first RDL 163 may be constructed beginning by forming a first passivation layer 114 directly over the adhesive 112. Passivation layers herein may comprise polyimide. Portions of the first passivation layer 114 are then removed from areas of the first RDL 163 using a lithographic process to expose the adhesive 112. Thus the passivation layer 114 comprises recessed areas such as 310 and 311 to provide electrical conductivity. A Physical Vapor Deposition (PVD) may then be used to form a first metal layer 116 that covers the adhesive 112 in the recessed areas 310 and 311 and remaining passivation layer 114 as shown in FIG. 2. The metal layers herein may comprise at least one of Ti, TiW, Ta, TiN, TaN, Cu, and Au, although another metal may be used.

Figure 3:
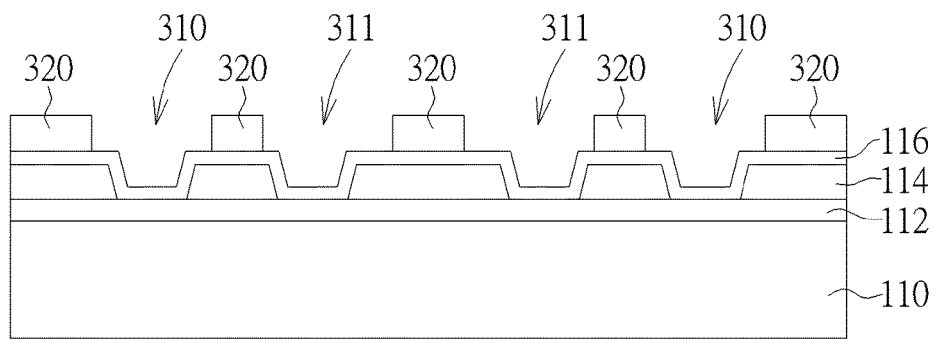
Figure 4:
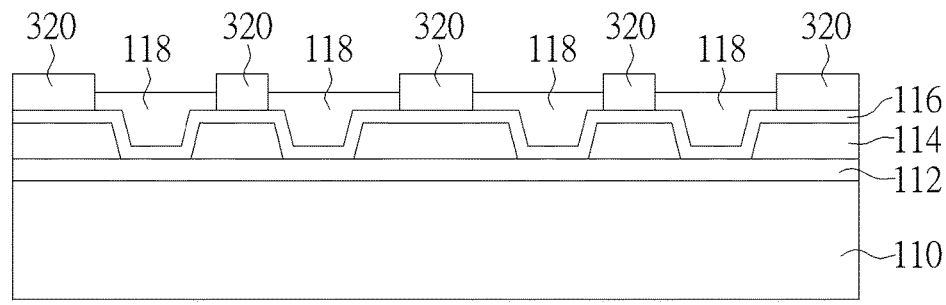
Figure 5:
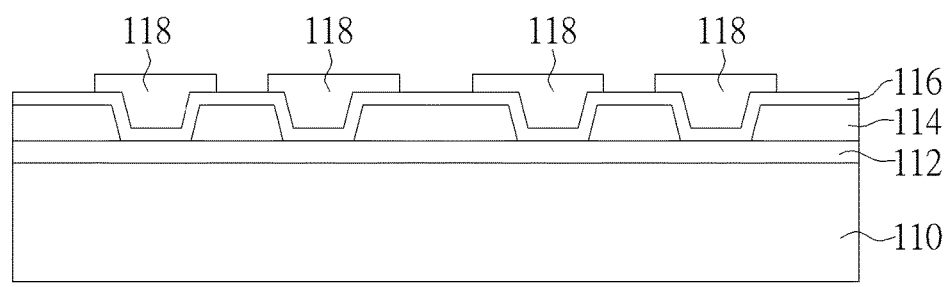
Figure 6:
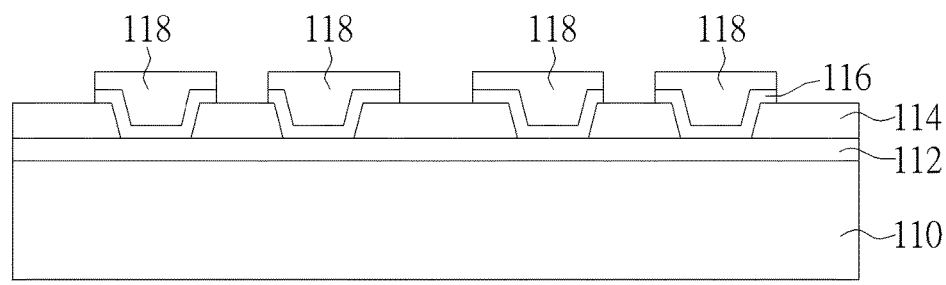

FIG. 3 shows a layer of photoresist 320 is applied to the top of the first metal layer 116 with portions of the photoresist 320 removed using another photolithographic process to expose desired areas of the first metal layer 116 while retaining photoresist 320 coverage of areas of the first metal layer 116 not required for conductivity. A second metal layer 118 may then be plated to the exposed first metal layer 116, filling the recessed areas 310 and 311 and extending above the first metal layer 116 as shown in FIG. 4. FIG. 5 shows how the remaining photoresist 320 is subsequently stripped from the first RDL 163. FIG. 6 illustrates how an Under Bump Metallization (UBM) etch is then used to remove the first metal layer 116 not covered by the second metal layer 118.

Figure 7:
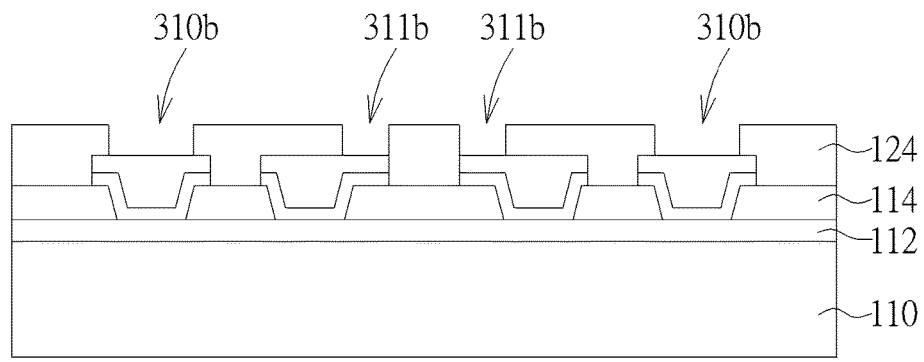

A second passivation layer 124 is then applied to cover both the first passivation layer 114 and the second metal layer 118. Another photolithographic process next forms recessed areas of the second passivation layer 124 exposing at least portions of the second metal layer 118 permitting conductivity. Examples of the recessed areas exposing the second metal layer 118 are 310b and 311b, which in this example may correspond to recessed areas 310 and 311, as shown in FIG. 7.

Figure 8:
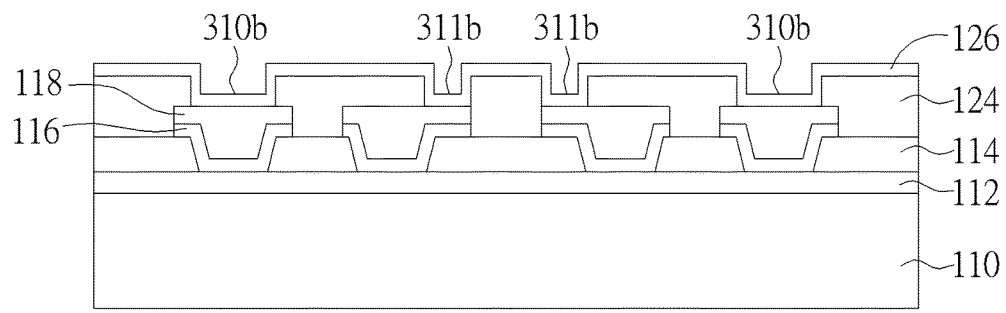

The RDL process described above or another RDL process may be repeated as often as necessary to form electrical connections in the desired areas of the first RDL 163. When the first RDL 163 has been completed, another PVD process covers recessed areas 310b and 311b and the remaining second passivation layer 124 with a third metal layer 126 as shown in FIG. 8.

Figure 9:
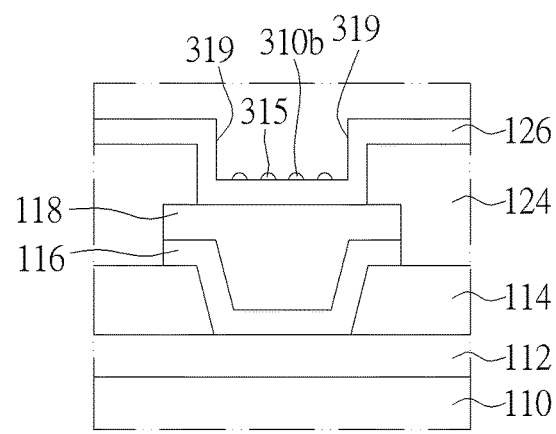

FIG. 9 is a close-up cross-sectional view of an example recessed areas 310b. As the second passivation layer 124 extends farther away from the carrier 110 than does a top surface of the exposed second metal layer 118, the recession 310b including sidewalls 319 is formed by the third metal layer 126 immediately over the exposed second metal layer 118. The sidewalls 319 may be substantially perpendicular to the plane of the carrier 110. Portions of the third metal layer 126 of the recessed areas 310b in contact with the second metal layer 118 within the recessed area 310b may be texturized (shown, for example, as a bump 315 in FIG. 9), such as with grooves, dimples, bumps or another pattern that increase the size of the surface area of that part of the recession 310.

Figure 10:
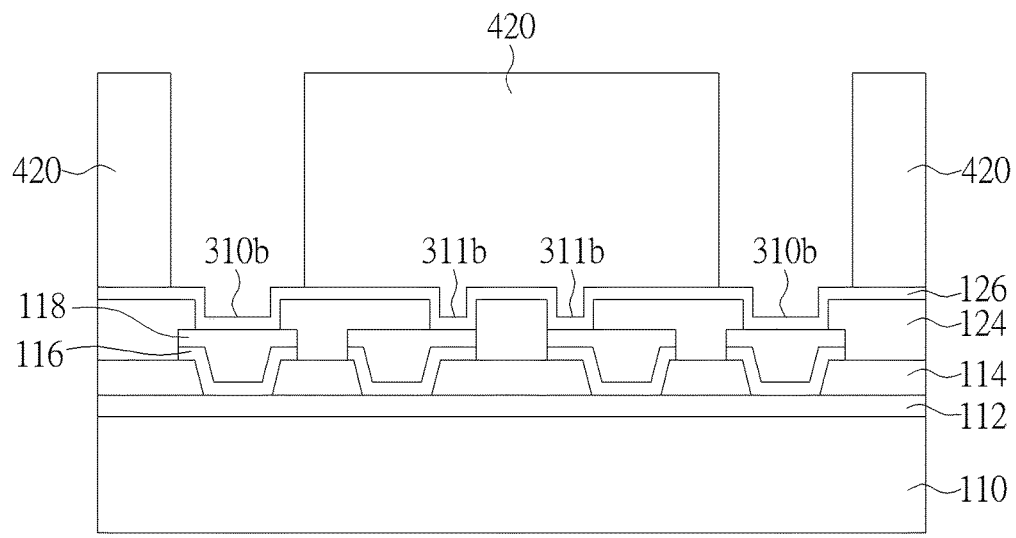

A dry film lamination process may then apply a thick layer of photoresist 420 covering the third metal layer 136. A lithographic process may then be used to form openings in the photoresist 420 over the recessed areas 310b to allow creation of metal pillars 425 to supply electrical conductivity to an upper layer. The lithographic process exposes the recessed areas 310b and may additionally expose a small portion of the third metal layer 136 immediately adjacent to the recessed areas 310b. Remaining portions of the photoresist are not removed by this process as shown in FIG. 10.

Figure 11:
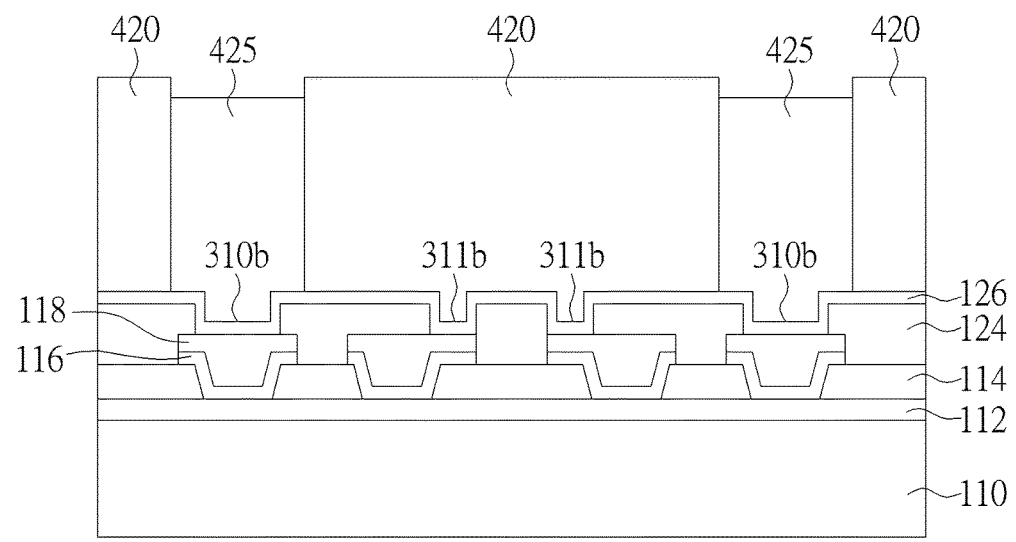
Figure 12:
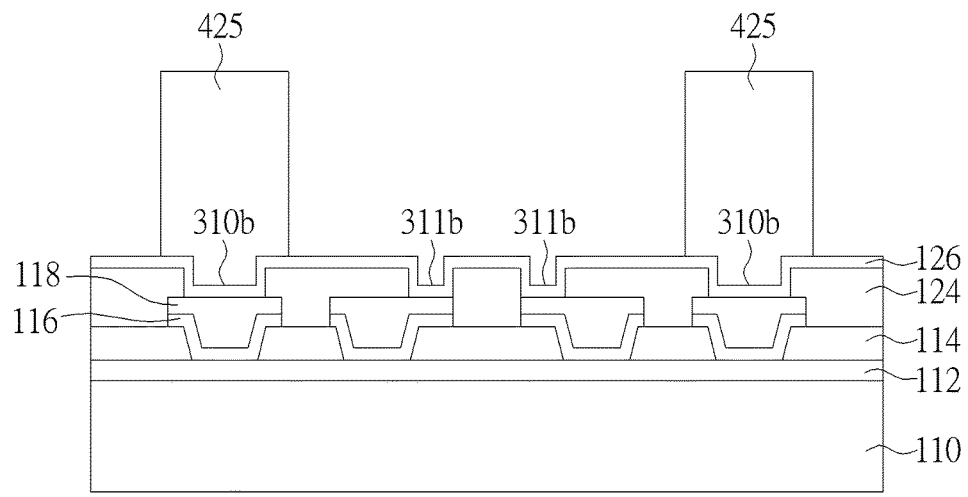
Figure 13:
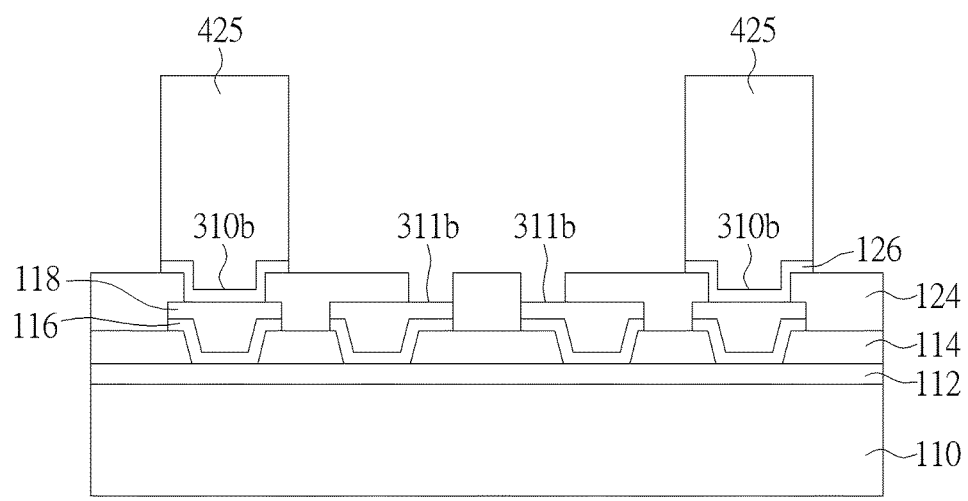

Another plating process is then performed to fill (or nearly fill) the openings in the photoresist 420 to create the metal pillars 425 (FIG. 11). The remaining photoresist 420 is then stripped from the third metal layer 126 exposing the metal pillars 425 and the third metal layer 126 as shown in FIG. 12. Finally, another UBM etching process is applied to remove the portion of the third metal layer 126 that is not cover by the metal pillars 425 optionally including from recessed areas 311b which intended to provide conductivity to the current layer.

Creating the metal pillars 425 so that the lower portion of each pillar 425 is seated within the sidewalls 319 of a recessed area 310b provides more contact area between the metal pillars 425 and the recessed areas 310b resulting in a tight and secure mounting of the metal pillars 425 to the third metal layer 136 to help solve the prior art problem of pillars 425 being knocked over during the manufacturing process. When texturized as in some embodiments, the increased area of the texturized portion 375 of the recessed 310b further enhances the strength of the mounting.

Figure 14:
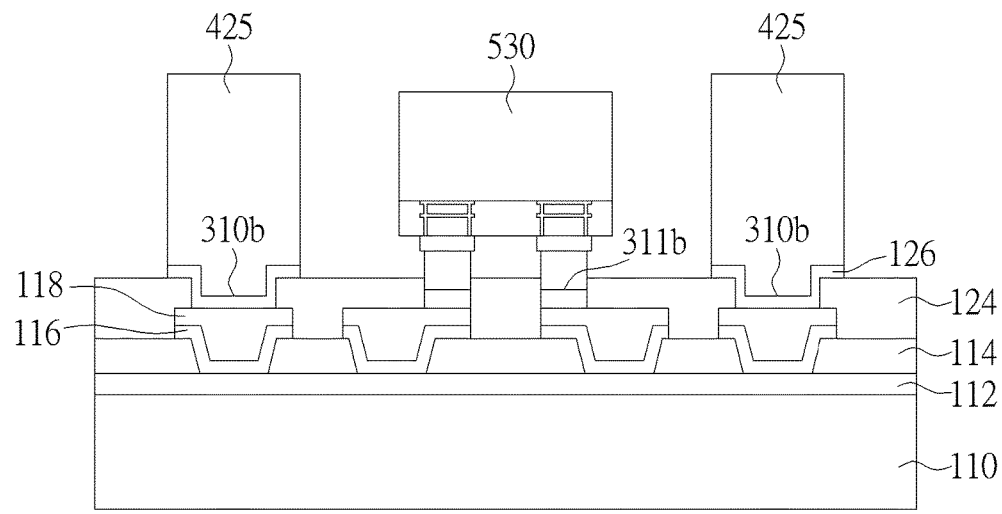
Figure 15:
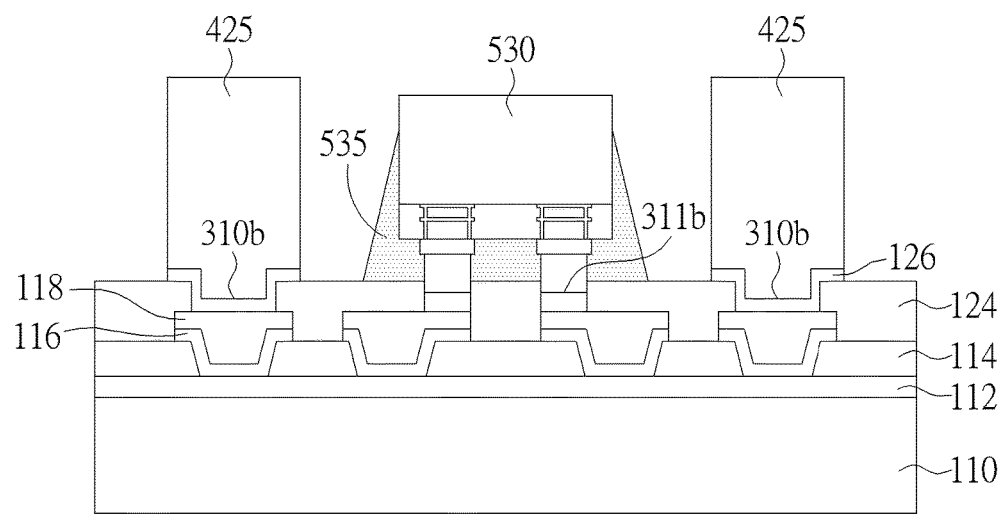

FIG. 14 shows a chip 530 may then be mounted to the recessed areas 311b between the metal pillars 425. Flip-chip bonding may be used in some embodiments although another method may suffice. To enhance strength and thermal conductivity of the package, FIG. 15 shows that an underfill material 535 may be applied filling the empty volume between the mounted chip 530 and the second passivation layer 124. Some embodiments use a capillary-flow material to form the underfill material 535. Using a capillary-flow material to form the underfill material 535 provides advantages over the prior art's usage of a molded underfill (MUF) by permitting choice of either a high or a low pad pitch (MUF requires a high pad pitch) as well as providing greater reliability.

Figure 16:
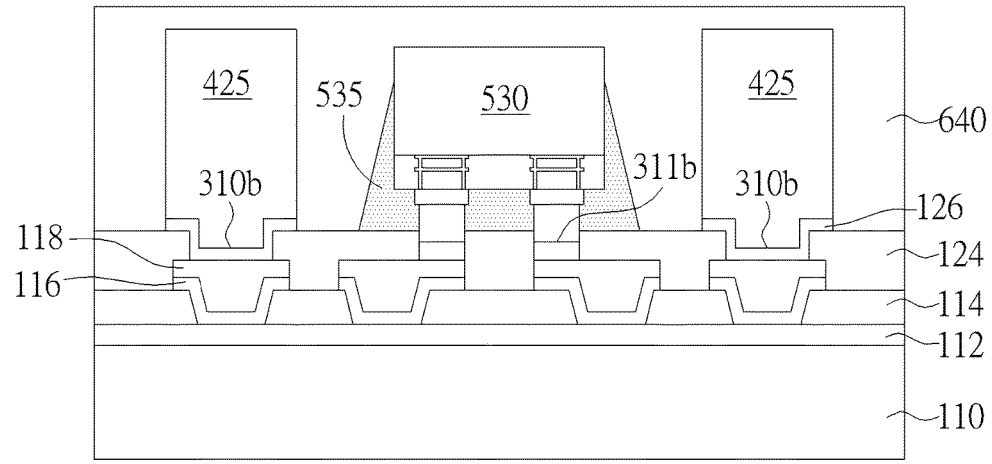
Figure 17:
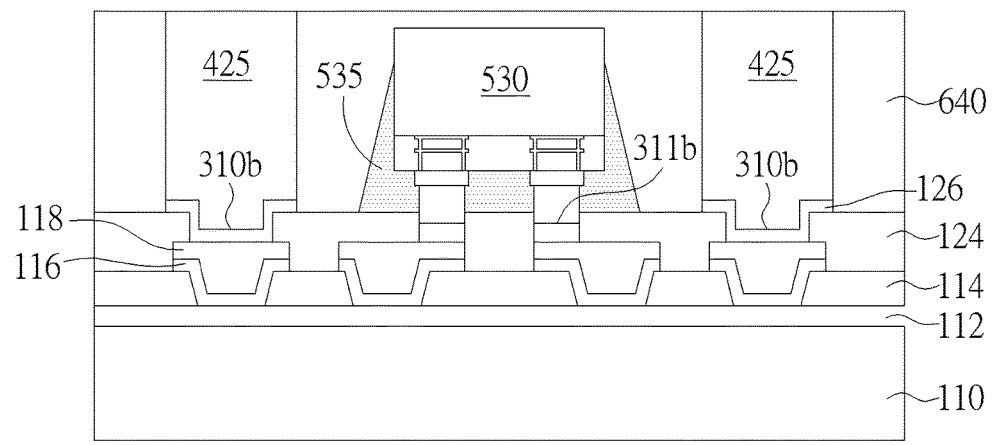
Figure 18:
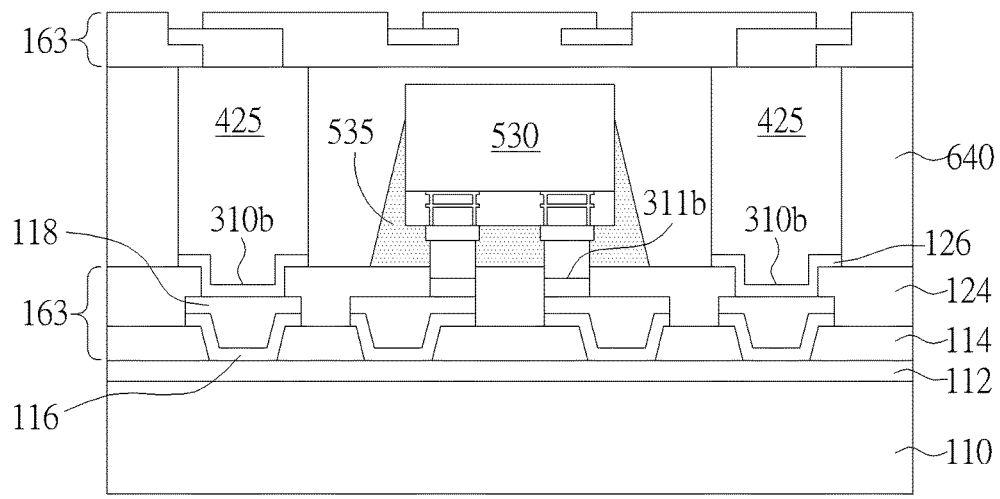

As shown in FIG. 16, the entire unit may then be covered and sealed with an epoxy molding compound (EMC) 640 possibly applied as a spin coat EMC, a dry film, or a compression mold EMC. FIG. 17 shows how the top surface of the EMC 640 may then be ground down with a grinding process to expose tops of the metal pillars 425 in preparation for a second layer of RDL 763. The example second layer of RDL 763 shown in FIG. 18 may be formed similarly to the first RDL 163 but is not required to be of the same structure. When a second RDL 763 is desired, a third passivation layer 134 is first applied to cover the metal pillars 425 and the EMC 640. The third passivation layer 134 is then removed from areas of the second RDL 763 to form the recessed areas similar to 310 and 311 using a lithographic process. A PVD process may then be used to form a metal layer that covers the recessed areas and remaining third passivation layer 134. The remainder of the second RDL 763 may be formed similarly to the remainder of the first RDL 163, or may be altered according to design considerations.

In summary, a fan-out semiconductor package is proposed. A layer of adhesive covers a top surface of a temporary carrier and an RDL comprising a first passivation layer adhering to the adhesive is added. Although one example of an RDL is illustrated above, one skilled in the art can readily see that different structures are also possible. A first metal layer forming recessed areas each electrically connected to the adhesive is then formed. metal pillars are each respectively plated to a different one of a first group of the recessed areas in the first metal layer. A semiconductor chip next is bonded to a second group of the recessed areas in the first metal layer and a molding compound covers the semiconductor chip and the first redistribution layer and ground to expose tops of the metal pillars. A second redistribution layer comprising a second passivation layer adhering to the molding compound is then added. A second metal layer covering openings in the second passivation layer exposing the tops of the metal pillars are then added. An underfill material comprising a capillary-flow material may be placed in spaces between the semiconductor chip and first redistribution layer.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A fan-out semiconductor package, comprising:
a temporary carrier;
a layer of adhesive covering a top surface of the temporary carrier;
a first redistribution layer disposed on the layer of adhesive, the first redistribution layer comprising:
a first metal layer having recessed areas;
metal pillars each respectively plated to a different one of a first group of the recessed areas in the first metal layer;

a semiconductor chip bonded to a second group of the recessed areas in the first metal layer;

a molding compound covering the semiconductor chip and the first redistribution layer, the molding compound exposing tops of the metal pillars; and a second redistribution layer on the molding compound and the tops of the metal pillars.

2. The fan-out semiconductor package of claim 1 wherein each of the recessed areas in the first metal layer comprises a bottom and sidewalls, the sidewalls substantially perpendicular to a plane of the temporary carrier, and the metal pillars are plated to both the bottom and the sidewalls of the recessed area.

3. The fan-out semiconductor package of claim 1 further comprising an underfill material in spaces between the semiconductor chip and the first redistribution layer.

4. The fan-out semiconductor package of claim 3 wherein the underfill material comprises a capillary-flow material.

5. The fan-out semiconductor package of claim 1 wherein the first redistribution layer further comprises a first passivation layer between the adhesive and at least part of the first metal layer.

6. The fan-out semiconductor package of claim 5 wherein the first passivation layer comprises a polyimide.

7. The fan-out semiconductor package of claim 1 wherein the second redistribution layer comprises:

a second passivation layer adhering to the molding compound, the second passivation layer comprising openings exposing the tops of the metal pillars; and a second metal layer covering the openings exposing the tops of the metal pillars.

8. The fan-out semiconductor package of claim 1 wherein at least one of the first metal layer and the metal pillars comprises at least one of Ti, TiW, Ta, TiN, TaN, Cu, and Au.

9. The fan-out semiconductor package of claim 1 wherein the molding compound is an epoxy molding compound applied as a spin coat, a dry film, or a compression molding.

10. The fan-out semiconductor package of claim 1 wherein the semiconductor chip is bonded to a second group of the recessed areas in the first metal layer using a flip-chip bonding process.

11. A method of forming a fan-out semiconductor package, the method comprising:

providing a temporary carrier;

covering a top surface of the temporary carrier with a layer of adhesive;

forming a first redistribution layer on the adhesive, the first redistribution layer comprising a first metal layer having recessed areas;

plating metal pillars each respectively plated to a different one of a first group of the recessed areas in the first metal layer;

bonding a semiconductor chip to a second group of the recessed areas in the first metal layer;

covering the semiconductor chip and the first redistribution layer with a molding compound, the molding compound exposing tops of the metal pillars; and forming a second redistribution layer on the molding compound and the tops of the metal pillars.

12. The method of claim 11 wherein each of the recessed areas in the first metal layer comprise a bottom and sidewalls, the sidewalls substantially perpendicular to a plane of the carrier, and the method further comprises plating the metal pillars to both the bottom and the sidewalls of the recessed area.

13. The method of claim 11 further comprising filling an underfill material into spaces between the semiconductor chip and first redistribution layer.

14. The method of claim 13 further comprising filling a capillary-flow material into the spaces between the semiconductor chip and first redistribution layer as the underfill material.

15. The method of claim 11 wherein forming the first redistribution layer further comprises forming a first passivation layer between the adhesive and at least part of the first metal layer.

16. The method of claim 15 further comprising forming the first passivation layer as comprising a polyimide.

17. The method of claim 11 wherein forming the second redistribution layer comprises:

forming a second passivation layer adhering to the molding compound, the second passivation layer comprising openings exposing the tops of the metal pillars; and forming a second metal layer covering the openings exposing the tops of the metal pillars.

18. The method of claim 11 further comprising forming at least one of the first metal layer and the metal pillars as comprising at least one of Ti, TiW, Ta, TiN, TaN, Cu, and Au.

19. The method of claim 11 wherein the molding compound is an epoxy molding compound and the method further comprises applying the epoxy molding compound as a spin coat, a dry film, or a compression molding process.

20. The method of claim 11 further comprising bonding the semiconductor chip to a second group of the recessed areas in the first metal layer using a flip-chip bonding process.

* * * * *